(12) United States Patent
Baek et al.

(10) Patent No.: US 10,055,152 B2
(45) Date of Patent: Aug. 21, 2018

(54) SEMICONDUCTOR DEVICES

(71) Applicant: SK hynix Inc., Icheon-si, Gyeonggi-do (KR)

(72) Inventors: Seung Geun Baek, Seoul (KR); Jin Hee Cho, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/605,207

(22) Filed: May 25, 2017

(65) Prior Publication Data

US 2018/0165024 A1 Jun. 14, 2018

(30) Foreign Application Priority Data

Dec. 14, 2016 (KR) .................. 10-2016-0170570

(51) Int. Cl.
 *G06F 12/123* (2016.01)
 *G06F 3/06* (2006.01)
 *G06F 12/06* (2006.01)

(52) U.S. Cl.
 CPC .......... *G06F 3/0619* (2013.01); *G06F 3/0656* (2013.01); *G06F 3/0659* (2013.01); *G06F 3/0673* (2013.01); *G06F 12/06* (2013.01); *G06F 2212/1032* (2013.01)

(58) Field of Classification Search
 CPC ... G06F 3/0619; G06F 12/0806; G06F 12/123
 USPC ..................................... 365/230.01
 See application file for complete search history.

(56) References Cited

U.S. PATENT DOCUMENTS 9,804,972 B2 * 10/2017 Benedict ............... G06F 12/123
2016/0078911 A1 * 3/2016 Fujiwara ............... G11C 29/022
 365/189.2
2016/0085691 A1 3/2016 Benedict et al.

FOREIGN PATENT DOCUMENTS

KR 20150072051 A 6/2015

* cited by examiner

*Primary Examiner* — Pho M Luu
*Assistant Examiner* — Xiaochun L Chen
(74) *Attorney, Agent, or Firm* — William Park & Associates Ltd.

(57) ABSTRACT

A semiconductor device includes a group control circuit configured to generate a specified address and a control code in response to a row address and an active command, a comparison control signal generation circuit configured to generate a comparison control signal in response to the active command and a set code, and a target address generation circuit configured to output the specified address as a target address in response to the control code and the comparison control signal.

20 Claims, 13 Drawing Sheets

FIG.3

| RADD<1> | RADD<2> | RADD<3> | ACCESSED WORD LINE |
|---------|---------|---------|--------------------|
| L | L | L | WL11 |
| L | L | H | WL12 |
| L | H | L | WL13 |
| L | H | H | WL14 |
| H | L | L | WL21 |
| H | L | H | WL22 |
| H | H | L | WL23 |
| H | H | H | WL24 | ary, and a target address generation circuit configured to output

SEMICONDUCTOR DEVICES

CROSS-REFERENCE TO RELATED APPLICATIONS

The present application claims priority under 35 U.S.C 119(a) to Korean Patent Application No. 10-2016-0170570, filed on Dec. 14, 2016, which is herein incorporated by references in its entirety.

BACKGROUND

1. Technical Field

Embodiments of the present disclosure relate to semiconductor devices executing a refresh operation.

2. Related Art

Each semiconductor device such as a dynamic random access memory (DRAM) device may include a plurality of memory cells for storing data. Each DRAM cell may be configured to include a cell capacitor and a cell transistor. The DRAM devices may store datum therein by discharging or charging the cell capacitors. Once a cell capacitor is charged or discharged to store datum therein, an amount of electric charge stored in the cell capacitor ideally has to be constant regardless of how much time elapses. However, the amount of electric charge stored in the cell capacitor may actually vary because of a voltage difference between the cell capacitor and a circuit adjacent to the cell capacitor, or because of a leakage current of the cell capacitor. In particular, if the amount of electric charge stored in the cell capacitor is reduced, the cell capacitor may lose datum stored therein which causes a malfunction of the DRAM device. Thus, DRAM devices may require a refresh operation to prevent the memory cells from losing their data.

With the development of process technologies semiconductor devices have become more highly integrated which leads to a reduction in a distance between the memory cells as well as a distance between word lines connected to the memory cells. If a distance between the word lines is reduced, data stored in adjacent memory cells may be changed due to a coupling phenomenon or an interference phenomenon between the word lines.

Recently, an additional refresh scheme has been applied to word lines adjacent to a target word line that is frequently accessed or activated, in order to prevent the memory cells connected to the word line adjacent to the target word line from losing their data due to the interference phenomenon between the word lines. The additional refresh scheme applied to the word line adjacent to the activated target word line is referred to as a smart refresh.

SUMMARY

Various embodiments are directed to semiconductor devices generating a target address for executing a refresh operation.

According to an embodiment, a semiconductor device includes a group control circuit configured to generate a specified address and a control code in response to a row address and an active command, a comparison control signal generation circuit configured to generate a comparison control signal in response to the active command and a set code, and a target address generation circuit configured to output the specified address as a target address in response to the control code and the comparison control signal.

According to another embodiment, a semiconductor device includes a group control circuit, a comparison control signal generation circuit, and a target address generation circuit. The group control circuit is configured to generate a specified address and a control code in response to a target address, a row address, and an active command. The comparison control signal generation circuit is configured to generate a comparison control signal in response to the active command and a set code. The target address generation circuit is configured to output the specified address as the target address in response to the control code and the comparison control signal.

According to another embodiment, a semiconductor device includes an internal command generation circuit, a group control circuit, a comparison control signal generation circuit, and a target address generation circuit. The internal command generation circuit is configured to generate an internal active command in response to a start control signal and an active command. The group control circuit is configured to generate a specified address and a control code in response to the start control signal, a row address, and the internal active command. The comparison control signal generation circuit is configured to generate a comparison control signal in response to the internal active command and a set code. The target address generation circuit is configured to output the specified address as a target address in response to the control code and the comparison control signal.

BRIEF DESCRIPTION OF THE DRAWINGS

Various embodiments of the present disclosure will become more apparent in view of the attached drawings and accompanying detailed description, in which:

FIG. 3 is a table illustrating example logic level combinations of a row address for selecting word lines included in the core region of FIG. 2;

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
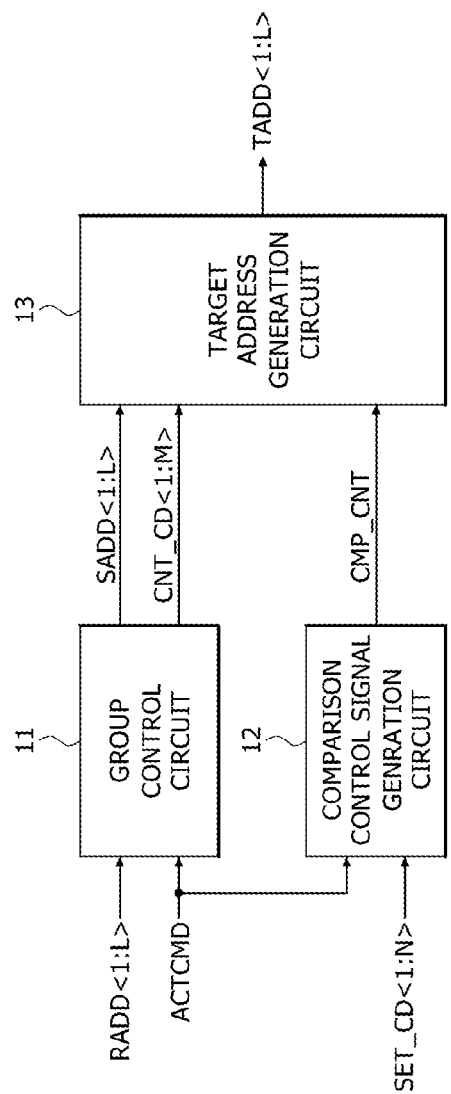
FIG. 1 is a block diagram illustrating a configuration of a semiconductor device according to an embodiment of the present disclosure.

As illustrated in FIG. 1, a semiconductor device according to an embodiment may include a group control circuit 11, a comparison control signal generation circuit 12, and a target address generation circuit 13.

The group control circuit 11 may generate a specified address SADD<1:L> and a control code CNT_CD<1:M> in response to a row address RADD<1:L> and an active command ACTCMD. The group control circuit 11 may select a target group (see FIG. 2) according to a logic level combination of the row address RADD<1:L> and may output a predetermined representative address of the selected target group as the specified address SADD<1:L>. The row address RADD<1:L> may have logic level combinations for selecting word lines included in a core region (2 of FIG. 2) of the semiconductor device. The number of bits included in the row address RADD<1:L> may differ according to the embodiment. Target groups selected according to level combinations of the row address RADD<1:L> and representative addresses of the target groups will be described later in detail with reference to FIGS. 2 and 3. The active command ACTCMD may be enabled so that the semiconductor device performs an active operation. The active command ACTCMD may be generated by a command decoder (not shown) that decodes an external command. The group control circuit 11 may generate the control code CNT_CD<1:M> that is sequentially incremented if the row address RADD<1:L> having a same logic level combination as the specified address SADD<1:L> is inputted to the group control circuit 11. The control code CNT_CD<1:M> may be inputted to the target address generation circuit 13 in synchronization with a time that the active command ACTCMD is enabled. The number of bits included in the control code CNT_CD<1:M> may differ according to the embodiment.

The comparison control signal generation circuit 12 may generate a comparison control signal CMP_CNT in response to the active command ACTCMD and a set code SET_CD<1:N>. The comparison control signal generation circuit 12 may generate the comparison control signal CMP_CNT which is enabled if an active operation is performed by the comparison control signal generation circuit 12 in response to the active command ACTCMD, where the active operation is performed the number of times that the set code SET_CD<1:N> is set. The number of times that the set code SET_CD<1:N> is set may differ according to the embodiment.

The target address generation circuit 13 may output the specified address SADD<1:L> as a target address TADD<1:L> in response to the comparison control signal CMP_CNT and the control code CNT_CD<1:M>. The target address generation circuit 13 may perform an update operation outputting the specified address SADD<1:L> as the target address TADD<1:L> if a count of the control code CNT_CD<1:M> is greater than a count of a code stored in the target address generation circuit 13 while the comparison control signal CMP_CNT is enabled after an active operation is performed a predetermined number of times. If the update operation is performed, the target address generation circuit 13 may internally store the control code CNT_CD<1:M> for a next update operation.

Figure 2:
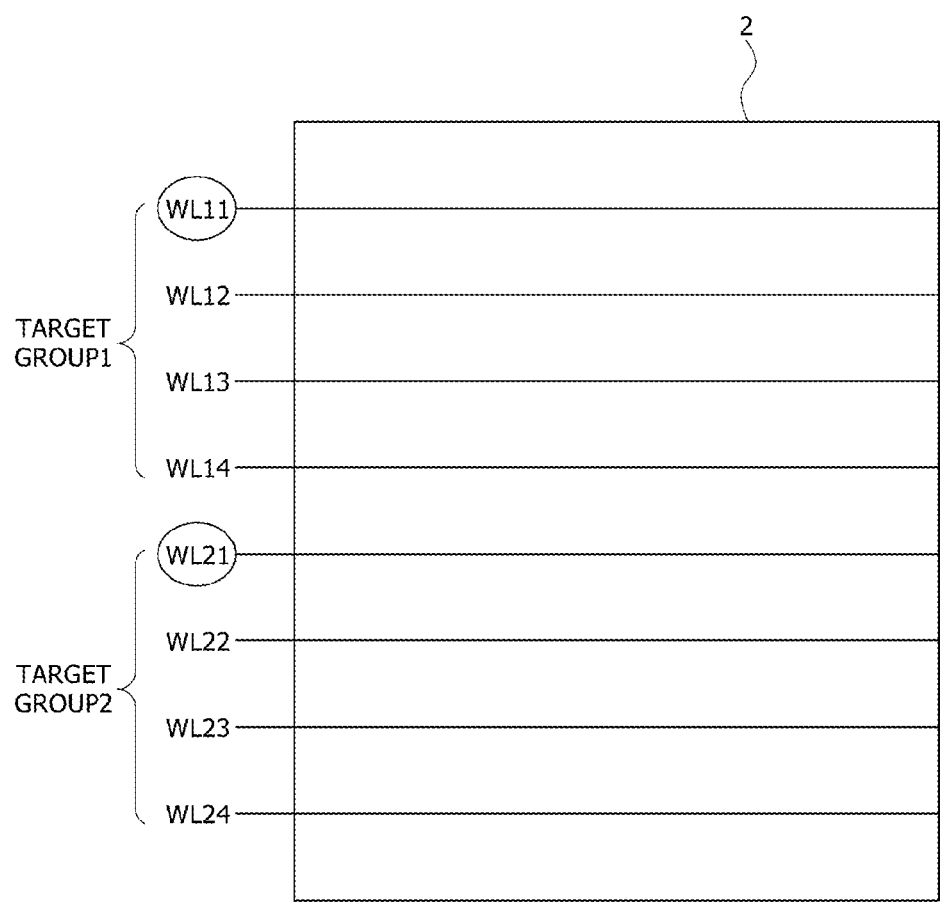
FIG. 2 illustrates an example of a layout diagram of word lines disposed in a core region of the semiconductor device shown in FIG. 1.

Referring to FIG. 2, the core region 2 may include a memory cell array comprised of a plurality of memory cells and a plurality of word lines WL11, WL12, WL13, WL14, WL21, WL22, WL23, and WL24 which are connected to the memory cell array. The word lines WL11, WL12, WL13, and WL14 may belong to a first target group (TARGET GROUP 1), and the word lines WL21, WL22, WL23, and WL24 may belong to a second target group (TARGET GROUP 2). That is, the first target group (TARGET GROUP 1) may include the word lines WL11, WL12, WL13, and WL14, and the second target group (TARGET GROUP 2) may include the word lines WL21, WL22, WL23, and WL24. A predetermined representative address of the first target group (TARGET GROUP 1) may be set to be a logic level combination of the row address RADD<1:L> for selecting a word line WL11. If the word lines WL11, WL12, WL13, and WL14 included in the first target group (TARGET GROUP 1) are activated by the row address RADD<1:L>, a logic level combination of the row address RADD<1:L> for selecting the word line WL11 may be selected and outputted as the specified address SADD<1:L>. A predetermined representative address of the second target group (TARGET GROUP 2) may be set to be a logic level combination of the row address RADD<1:L> for selecting the word line WL21. If the word lines WL21, WL22, WL23, and WL24 included in the second target group (TARGET GROUP 2) are activated by the row address RADD<1:L>, a logic level combination of the row address RADD<1:L> for selecting the word line WL21 may be selected and outputted as the specified address SADD<1:L>. The predetermined representative addresses of the first and second target groups (TARGET GROUP 1 and TARGET GROUP 2) may differ according to the embodiment.

Referring to FIG. 3, logic level combinations of the row address RADD<1:3> for selecting the word lines WL11, WL12, WL13, WL14, WL21, WL22, WL23, and WL24 are listed. A bit RADD<1> of the row address RADD<1:3> may have a logic "low(L)" level to select any one of the word lines WL11, WL12, WL13, and WL14 included in the first target group (TARGET GROUP 1), and the bit RADD<1> of the row address RADD<1:3> may have a logic "high(H)" level to select any one of the word lines WL21, WL22, WL23, and WL24 included in the second target group (TARGET GROUP 2). The row address RADD<1:3> may have a logic level combination of 'L, L, L' to select the word line WL11, and the row address RADD<1:3> may have a logic level combination of 'L, L, H' to select the word line WL12. In addition, the row address RADD<1:3> may have a logic level combination of 'L, H, L' to select the word line WL13, and the row address RADD<1:3> may have a logic level combination of 'L, H, H' to select the word line WL14. In the row address RADD<1:3>, the logic level combination of 'L, L, H' means that the bits RADD<1>, RADD<2>, and RADD<3> have a logic "low" level, a logic "low" level, and a logic "high" level, respectively. The row address RADD<1:3> having a logic level combination of 'L, L, L' may be set as a representative address of the first target group (TARGET GROUP 1) to select the word line WL11. The row address RADD<1:3> may have a logic level combination of 'H, L, L' to select the word line WL21, and the row address RADD<1:3> may have a logic level combination of 'H, L, H' to select the word line WL22. In addition, the row address RADD<1:3> may have a logic level combination of 'H, H, L' to select the word line WL23, and the row address RADD<1:3> may have a logic level combination of 'H, H, H' to select the word line WL24. The row address RADD<1:3> having a logic level combination of 'H, L, L' may be set as a representative address of the second target group (TARGET GROUP 2) to select the word line WL21. If the bit RADD<1> of the row address RADD<1:3> has a logic "low" level to select any one of the word lines WL11, WL12, WL13, and WL14 included in the first target group (TARGET GROUP 1), the row address RADD<1:3> having a logic level combination of 'L, L, L' which is set as the representative address of the first target group (TARGET GROUP 1) may be selected and outputted as the specified address SADD<1:L>. If the bit RADD<1> of the row address RADD<1:3> has a logic "high" level to select any one of the word lines WL21, WL22, WL23, and WL24 included in the second target group (TARGET GROUP 2), the row address RADD<1:3> having a logic level combination of 'H, L, L' which is set as the representative address of the second target group (TARGET GROUP 2) may be selected and outputted as the specified address SADD<1:L>.

Figure 4:
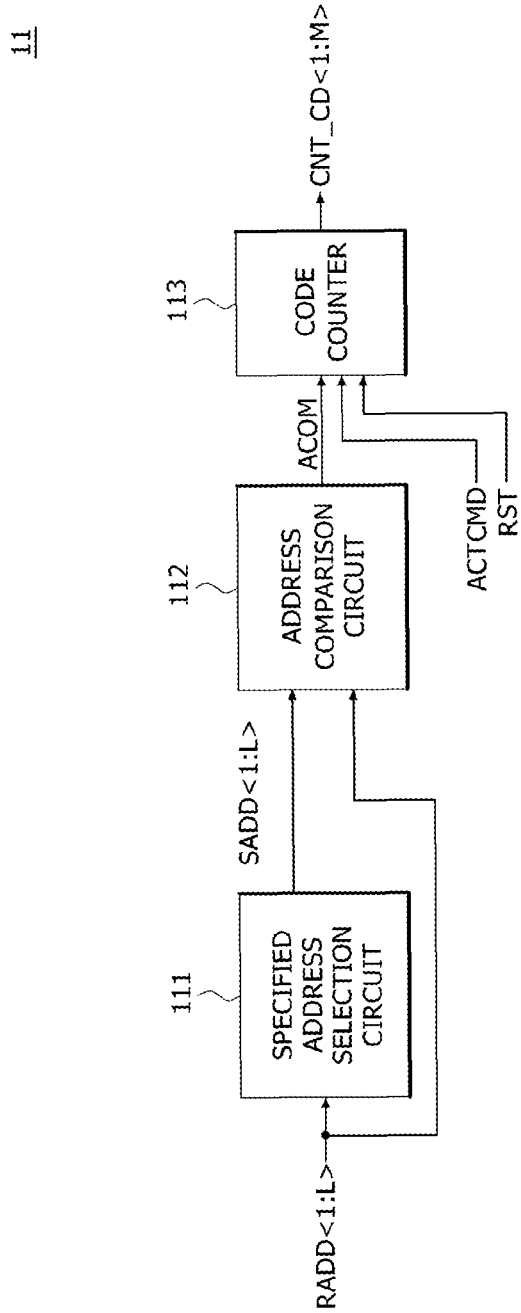
FIG. 4 is a block diagram illustrating an example configuration of a group control circuit included in the semiconductor device of FIG. 1.

Referring to FIG. 4, the group control circuit 11 may include a specified address selection circuit 111, an address comparison circuit 112, and a code counter 113.

The specified address selection circuit 111 may select one of the target groups in response to the row address RADD<1:L> and may output a representative address of the selected target group as the specified address SADD<1:L>. The specified address selection circuit 111 may have information about the target groups included in the core region having a memory cell array and information about the representative addresses of the target groups. The number of the target groups included in the core region and the representative addresses of the target groups may differ according to the embodiment. A configuration of the target groups and the representative addresses of the target groups have been already described in detail with reference to FIGS. 2 and 3. Thus, a description of the configuration of the target groups and a description of the representative addresses of the target groups will be omitted hereinafter. The specified address selection circuit 111 may be designed so that an operation of selecting and outputting the specified address SADD<1:L> in response to the row address RADD<1:L> is performed when the active operation is executed in a predetermined order according to the active command ACTCMD.

The address comparison circuit 112 may generate an address comparison signal ACOM in response to the row address RADD<1:L> and the specified address SADD<1:L>. The address comparison circuit 112 may compare the row address RADD<1:L> with the specified address SADD<1:L> to generate an address comparison signal ACOM. The address comparison circuit 112 may generate the address comparison signal ACOM which is enabled if the row address RADD<1:L> and the specified address SADD<1:L> have the same logic level combination. An enabled logic level address comparison signal ACOM may differ according to the embodiment. The address comparison circuit 112 may be designed so that generating the address comparison signal ACOM in response to the row address RADD<1:L> and the specified address SADD<1:L> is performed whenever the active operation is executed in response to the active command ACTCMD.

The code counter 113 may generate the control code CNT_CD<1:M> in response to the active command ACTCMD, the address comparison signal ACOM, and a reset signal RST. The code counter 113 may generate the control code CNT_CD<1:M> that is incremented if an enabled address comparison signal ACOM is inputted while the active operation is executed. The code counter 113 may increment the control code CNT_CD<1:M> if the address comparison signal ACOM indicates that the row address RADD<1:L> and the specified address SADD<1:L> have the same logic level combination while the active operation is executed. For example, if the control code CNT_CD<1:M> has two bits, the control code CNT_CD<1:2> may be incremented bit by bit to have a sequence of logic level combinations of 'L, L', 'L, H', 'H, L' and 'H, H'. The number of bits included in the control code CNT_CD<1:M> and a manner of incrementing the control code CNT_CD<1:M> may differ according to the embodiment. The code counter 113 may initialize the control code CNT_CD<1:M> in response to the reset signal RST. The code counter 113 may initialize the control code CNT_CD<1:M> so that the control code CNT_CD<1:M> has an initial logic level combination if the reset signal RST is enabled. For example, if the control code CNT_CD<1:M> has two bits, the control code CNT_CD<1:2> may be initialized to have a logic level combination of 'L, L'. An initialized logic level combination of the control code CNT_CD<1:M> may differ according to the embodiment. The reset signal RST may be generated in the semiconductor device or may be provided from an external device according to the embodiment.

Figure 5:
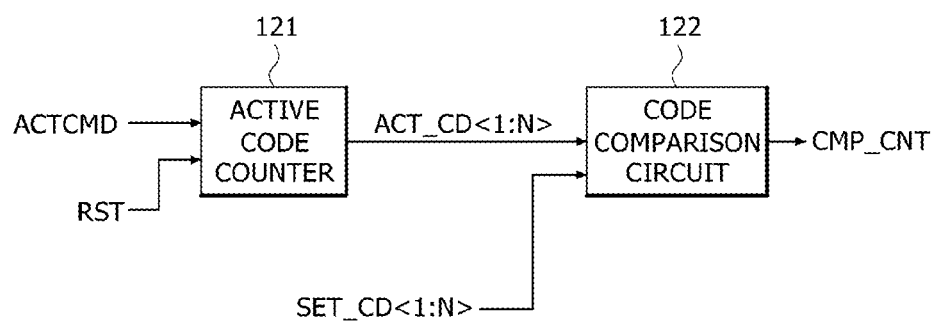
FIG. 5 is a block diagram illustrating an example configuration of a comparison control signal generation circuit included in the semiconductor device of FIG. 1.

Referring to FIG. 5, the comparison control signal generation circuit 12 may include an active code counter 121 and a code comparison circuit 122.

The active code counter 121 may generate an active code ACT_CD<1:N> in response to the active command ACTCMD and the reset signal RST. The active code counter 121 may generate the active code ACT_CD<1:N> which is incremented the number of times that an active operation is performed in response to the active command ACTCMD. The active code counter 121 may generate the active code ACT_CD<1:N> that is incremented in synchronization with a time that the active command ACTCMD is enabled. For example, if the active code ACT_CD<1:N> has two bits, the active code ACT_CD<1:2> may be incremented in sequence bit by bit to have logic level combinations of 'L, L', 'L, H', 'H, L' and 'H, H'. The number of bits included in the active code ACT_CD<1:N> and a manner of incrementing the active code ACT_CD<1:N> may differ according to the embodiment. The number of times that the active operation is executed may be confirmed by a logic level combination of the active code ACT_CD<1:N>. The active code counter 121 may initialize the active code ACT_CD<1:N> so that the active code ACT_CD<1:N> has an initial logic level combination if the reset signal RST is enabled. For example, if the active code ACT_CD<1:N> has two bits, the active code ACT_CD<1:2> may be initialized to have a logic level combination of 'L, L'. An initialized logic level combination of the active code ACT_CD<1:N> may differ according to the embodiment. The reset signal RST may be generated in the semiconductor device or may be provided from an external device according to the embodiment.

The code comparison circuit 122 may generate the comparison control signal CMP_CNT in response to the active code ACT_CD<1:N> and the set code SET_CD<1:N>. The code comparison circuit 122 may compare the active code ACT_CD<1:N> with the set code SET_CD<1:N> to generate the comparison control signal CMP_CNT which is enabled if the active code ACT_CD<1:N> count corresponds to a logic level combination of the set code SET_CD<1:N>. For example, if an active operation is executed three times with the set code SET_CD<1:N> having a logic level combination of 'H, L', the comparison control signal CMP_CNT may be enabled because the active code ACT_CD<1:N> is incremented three times to have a logic level combination of 'H, L'.

Figure 6:
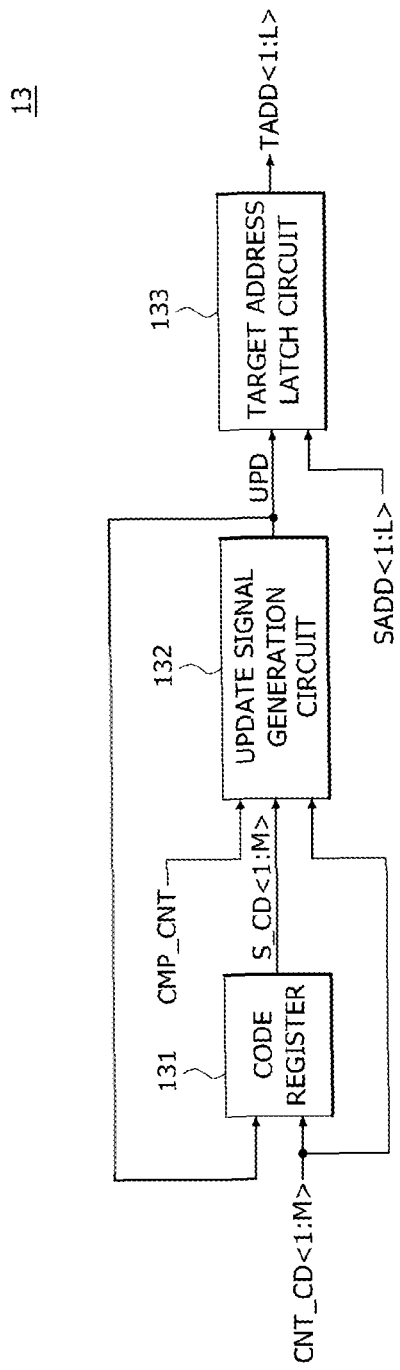
FIG. 6 is a block diagram illustrating an example configuration of a target address generation circuit included in the semiconductor device of FIG. 1.

Referring to FIG. 6, the target address generation circuit 13 may include a code register 131, an update signal generation circuit 132, and a target address latch circuit 133.

The code register 131 may store the control code CNT_CD<1:M> therein in response to an update signal UPD and may output the stored control code CNT_CD<1:M> as a storage code S_CD<1:M>. The code register 131 may receive the control code CNT_CD<1:M> to store the control code CNT_CD<1:M> if the update signal UPD is enabled. The code register 131 may output the stored control code CNT_CD<1:M> as a storage code S_CD<1:M>.

The update signal generation circuit 132 may generate the update signal UPD from the control code CNT_CD<1:M> and the storage code S_CD<1:M> in response to the comparison control signal CMP_CNT. The update signal generation circuit 132 may compare the control code CNT_CD<1:M> with the storage code S_CD<1:M> to generate the update signal UPD if the active operation is executed a predetermined number of times to enable the comparison control signal CMP_CNT. The update signal generation circuit 132 may generate the update signal UPD which is enabled if the control code CNT_CD<1:M> count is greater than or equal the storage code S_CD<1:M> count while the comparison control signal CMP_CNT is enabled. Alternatively, the target address generation circuit 13 may store the control code CNT_CD<1:M> as the storage code S_CD<1:M> if the count of the control code CNT_CD<1:M> is greater than or equal to a count of the storage code S_CD<1:M> while the comparison control signal CMP_CNT is enabled. The number of times that the control code CNT_CD<1:M> and the storage code S_CD<1:M> incremented may be confirmed by logic level combinations of the control code CNT_CD<1:M> and the storage code S_CD<1:M>.

The target address latch circuit 133 may generate the target address TADD<1:L> from the specified address SADD<1:L> in response to the update signal UPD. The target address latch circuit 133 may perform the update operation by outputting the specified address SADD<1:L> as the target address TADD<1:L> if the update signal UPD is enabled.

Figure 7:
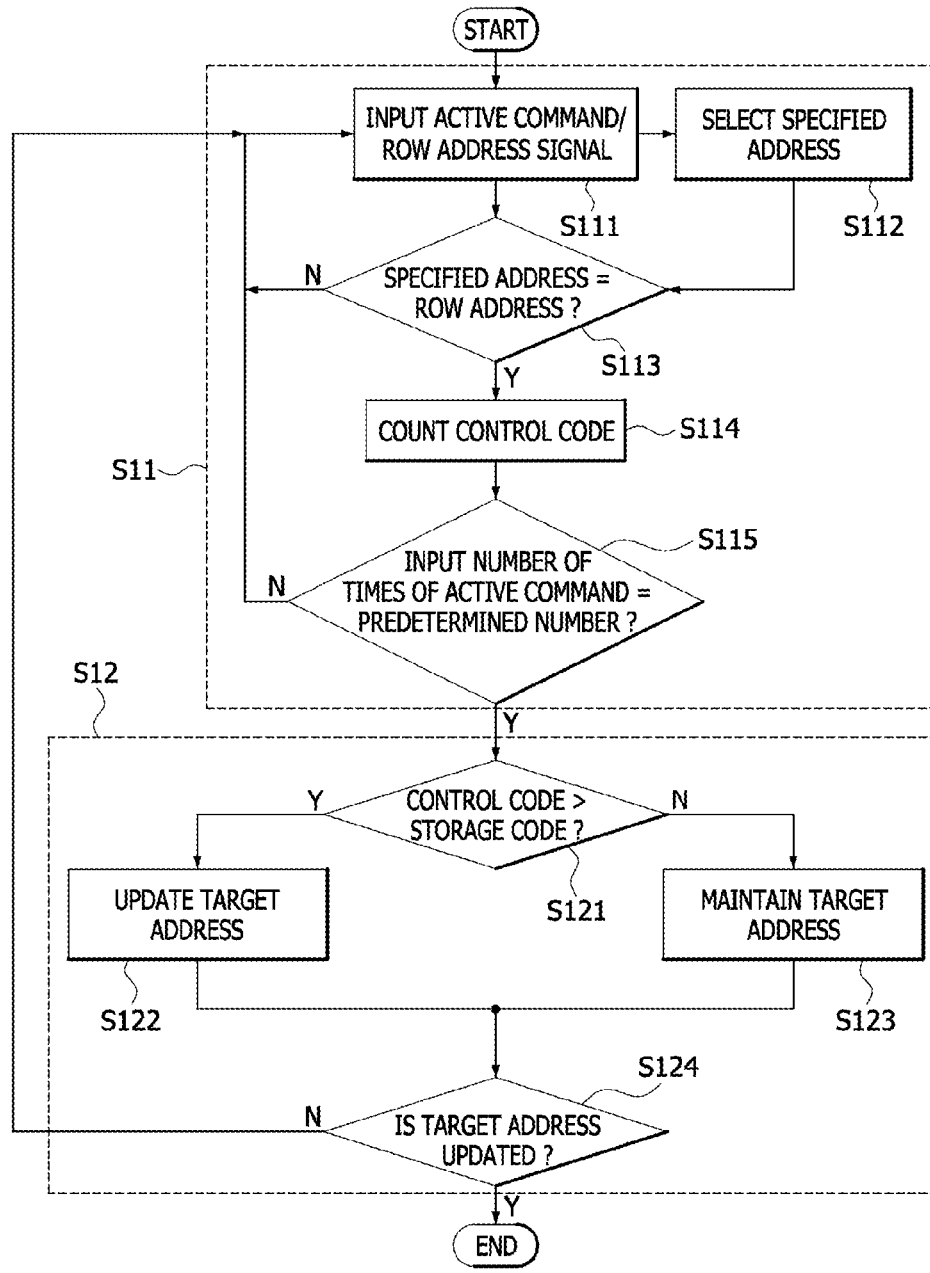
FIG. 7 is a flowchart illustrating an operation of the semiconductor device shown in FIGS. 1 to 6.

An operation for generating a target address to execute a refresh operation of the semiconductor device having the aforementioned configuration will be described hereinafter with reference to FIG. 7.

First, an operation of counting the control code CNT_CD<1:M> associated with a specified address SADD<1:L> may be performed while the active operation is executed the number of times which is set by the set code SET_CD<1:N> (see a step S11). Next, an operation of updating the target address TADD<1:L> for a refresh operation may be performed if the control code CNT_CD<1:M> count is greater than the storage code S_CD<1:M> count (see a step S12).

The operation (the step S11) of counting the control code CNT_CD<1:M> will be described more fully hereinafter.

If the active operation is executed and the row address RADD<1:L> is inputted to the semiconductor device in synchronization with a time that the active command ACTCMD is enabled (see a step S111), one of the target groups may be selected according to a logic level combination of the row address RADD<1:L> and the representative address of the selected target group may be the specified address SADD<1:L> (see step S112). While the active operations are executed in sequence, the row address RADD<1:L> and the specified address SADD<1:L> inputted in synchronization with the active command ACTCMD may be compared with each other (see a step S113). If the row address RADD<1:L> and the specified address SADD<1:L> are identical to each other, the control code CNT_CD<1:M> may be incremented (see step S114). The step S113 of comparing the row address RADD<1:L> with the specified address SADD<1:L> and the step S114 of incrementing the control code CNT_CD<1:M> may be repeated until the active command ACTCMD is inputted a predetermined number of times (see step S115).

The operation (the step S12) of updating the target address TADD<1:L> will be described more fully hereinafter.

After the active command ACTCMD is inputted the predetermined number of times, the control code CNT_CD<1:M> count may be compared with the storage code S_CD<1:M> count(see step S121). If the control code CNT_CD<1:M> count is equal to or greater than the storage code S_CD<1:M> count, the target address TADD<1:L> may be updated as the specified address SADD<1:L> (see step S122). If the control code CNT_CD<1:M> count is less than the storage code S_CD<1:M> count, the target address TADD<1:L> may be maintained (see step S123). A discrimination between whether or not memory cells corresponding to the target address TADD<1:L> are refreshed may be made (see step S124). If the memory cells corresponding to the target address TADD<1:L> are not refreshed, the step S11 of incrementing the control code CNT_CD<1:M> may be performed again.

Figure 8:
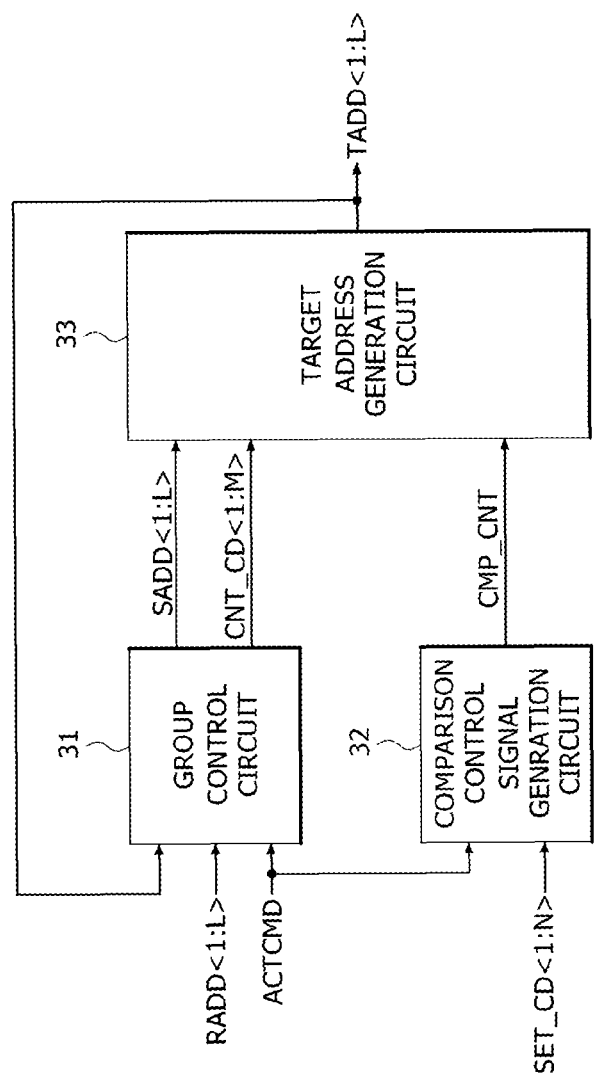
FIG. 8 is a block diagram illustrating a configuration of a semiconductor device according to another embodiment of the present disclosure.

As illustrated in FIG. 8, a semiconductor device according to another embodiment may include a group control circuit 31, a comparison control signal generation circuit 32, and a target address generation circuit 33.

The group control circuit 31 may generate a specified address SADD<1:L> and a control code CNT_CD<1:M> in response to a target address TADD<1:L>, a row address RADD<1:L>, and an active command ACTCMD. The group control circuit 31 may select a target group (see FIG. 2, for example) according to a logic level combination of the row address RADD<1:L> and may output a predetermined representative address of the selected target group as the specified address SADD<1:L>. The group control circuit 31 may maintain a previous logic level combination of the specified address SADD<1:L> if the row address RADD<1:L> inputted to select the specified address SADD<1:L> is identical to the target address TADD<1:L>. The group control circuit 31 may select a target group in response to the row address RADD<1:L> if the row address RADD<1:L> inputted to select the specified address SADD<1:L> is different from the target address TADD<1:L>. The row address RADD<1:L> may have logic level combinations for selecting word lines included in a core region (not shown) of the semiconductor device. The number of bits included in the row address RADD<1:L> may be set to be diff according to the embodiment. The active command ACTCMD may be enabled to perform an active operation. The active command ACTCMD may be generated by a command decoder (not shown) that decodes an external command. The group control circuit 31 may generate the control code CNT_CD<1:M> that is sequentially incremented if a row address RADD<1:L> having a same logic level combination as the specified address SADD<1:L> is inputted in synchronization with a time that the active command ACTCMD is enabled. The number of bits included in the control code CNT_CD<1:M> may differ according to the embodiment.

The comparison control signal generation circuit 32 may generate a comparison control signal CMP_CNT in response to the active command ACTCMD and a set code SET_CD<1:N>. The comparison control signal generation circuit 32 may generate the comparison control signal CMP_CNT which is enabled if the active operation is performed in response to the active command ACTCMD the number of times which the set code SET_CD<1:N> is set. The number of times which the code SET_CD<1:N> is set may differ according to the embodiment.

The target address generation circuit 33 may output the specified address SADD<1:L> as the target address TADD<1:L> in response to the comparison control signal CMP_CNT and the control code CNT_CD<1:M>. The target address generation circuit 33 may perform an update operation outputting the specified address SADD<1:L> as the target address TADD<1:L> if the control code CNT_CD<1:M> count is greater than the code count (not shown) stored in the target address generation circuit 33 while the comparison control signal CMP_CNT is enabled after the active operation is performed by the predetermined number of times. If the update operation is performed, the target address generation circuit 33 may internally store the control code CNT_CD<1:M> for a next update operation.

Figure 9:
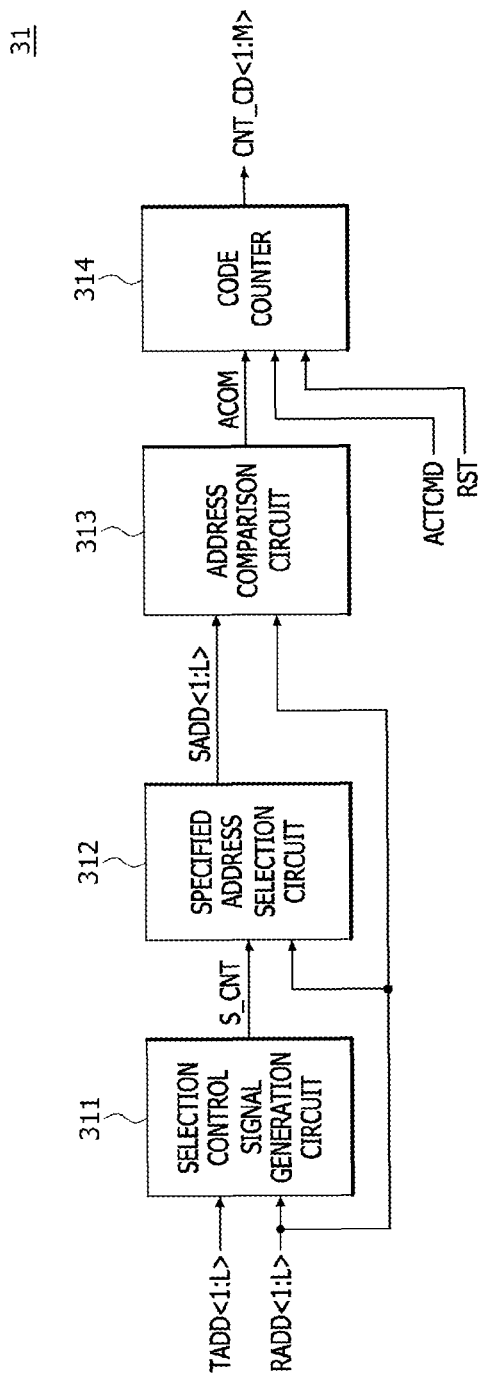
FIG. 9 is a block diagram illustrating an example configuration of a group control circuit included in the semiconductor device of FIG. 8.

Referring to FIG. 9, the group control circuit 31 may include a selection control signal generation circuit 311, a specified address selection circuit 312, an address comparison circuit 313, and a code counter 314.

The selection control signal generation circuit 311 may generate a selection control signal S_CNT in response to the row address RADD<1:L> and the target address TADD<1:L>. The selection control signal generation circuit 311 may generate the selection control signal S_CNT which is enabled if the row address RADD<1:L>, which is inputted to select the specified address SADD<1:L>, is different from the target address TADD<1:L>. The selection control signal generation circuit 311 may generate the selection control signal S_CNT which is disabled if the row address RADD<1:L>, which is inputted to select the specified address SADD<1:L>, is identical to the target address TADD<1:L>.

The specified address selection circuit 312 may generate the specified address SADD<1:L> from the row address RADD<1:L> in response to the selection control signal S_CNT. The specified address selection circuit 312 may select one of the target groups in response to the row address RADD<1:L> if the selection control signal S_CNT is enabled and may output a representative address of the selected target group as the specified address SADD<1:L>. The specified address selection circuit 312 may have information on the target groups included in the core region having a memory cell array and information on the representative addresses of the target groups. The number of the target groups included in the core region and the representative addresses of the target groups may differ according to the embodiment. The specified address selection circuit 312 may be designed so that an operation of the specified address selection circuit 312 selecting and outputting the specified address SADD<1:L> in response to the row address RADD<1:L> is performed when the active operation is executed in a predetermined order according to the active command ACTCMD.

The address comparison circuit 313 may generate an address comparison signal ACOM in response to the row address RADD<1:L> and the specified address SADD<1:L>. The address comparison circuit 313 may generate the address comparison signal ACOM which is enabled if the row address RADD<1:L> and the specified address SADD<1:L> have the same logic level combination. A logic level of the address comparison signal ACOM which is enabled may differ according to the embodiment. The address comparison circuit 313 may be designed so that an operation of the address comparison circuit 313 generating the address comparison signal ACOM in response to the row address RADD<1:L> and the specified address SADD<1:L> is performed whenever the active operation is executed in response to the active command ACTCMD.

The code counter 314 may generate the control code CNT_CD<1:M> in response to the active command ACTCMD, the address comparison signal ACOM, and a reset signal RST. The code counter 314 may generate the control code CNT_CD<1:M> that may be counted in response to the address comparison signal ACOM. For example, the code counter 314 may generate the control code CNT_CD<1:M> that is incremented in response to the active command ACTCMD, if the enabled address comparison signal ACOM is inputted while the active operation is executed. The code counter 314 may increment the control code CNT_CD<1:M> if the row address RADD<1:L> and the specified address SADD<1:L> have the same logic level combination while the active operation is executed.

For example, if the control code CNT_CD<1:M> has two bits, the control code CNT_CD<1:2> may be incremented up bit by bit to have logic level combinations of 'L, L', 'L, H', 'H, L' and 'H, H' in sequence. The number of bits included in the control code CNT_CD<1:M> and a manner of incrementing the control code CNT_CD<1:M> may differ according to the embodiment. The code counter 314 may initialize the control code CNT_CD<1:M> in response to the reset signal RST. The code counter 314 may initialize the control code CNT_CD<1:M> so that the control code CNT_CD<1:M> has an initial logic level combination if the reset signal RST is enabled. For example, if the control code CNT_CD<1:M> has two bits, the control code CNT_CD<1:2> may be initialized to have a logic level combination of 'L, L'. An initialized logic level combination of the control code CNT_CD<1:M> may differ according to the embodiment. The reset signal RST may be generated in the semiconductor device or may be provided from an external device according to the embodiment.

Figure 10:
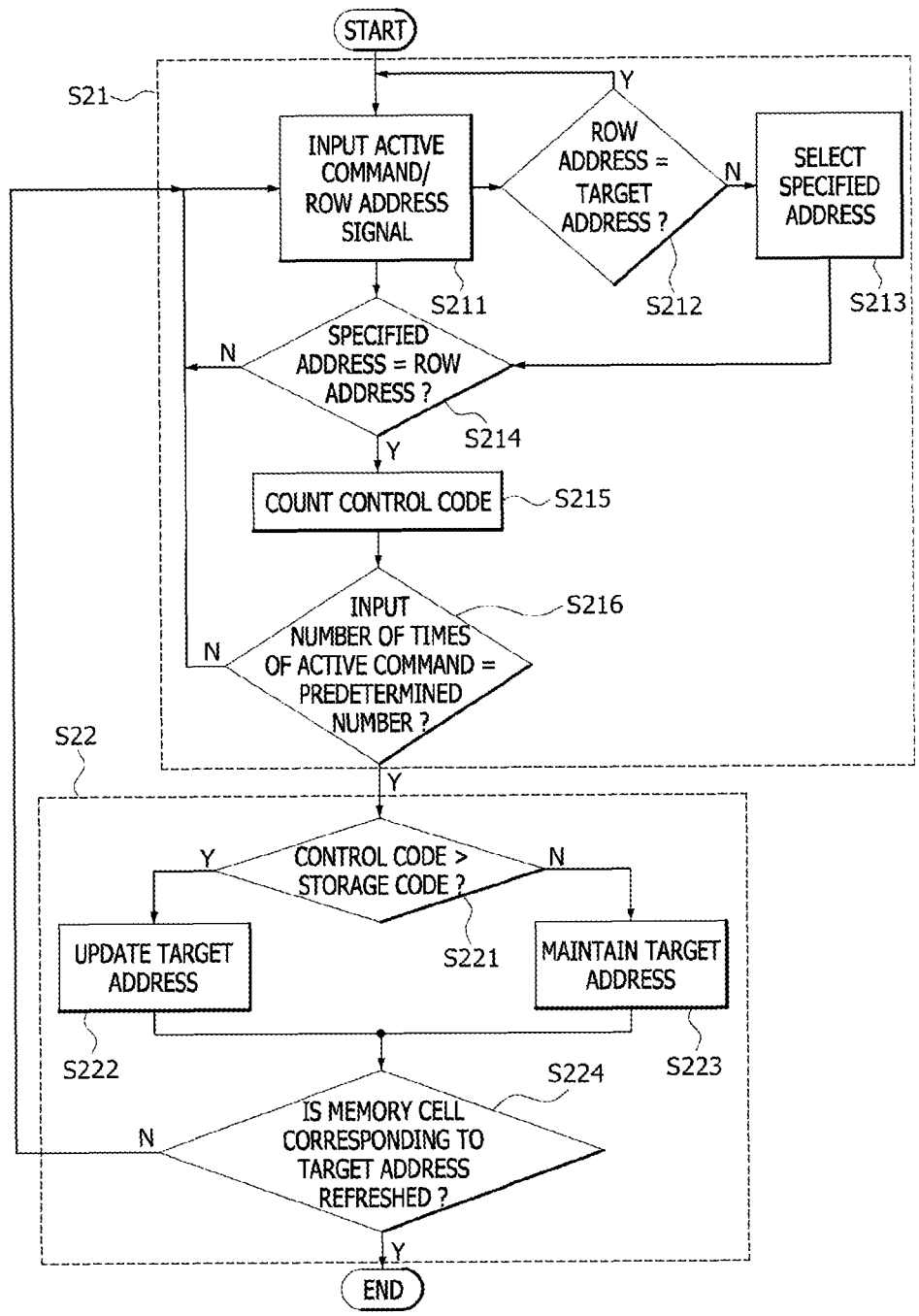
FIG. 10 is a flowchart illustrating an operation of the semiconductor device shown in FIGS. 8 and 9.

An operation for generating a target address to execute a refresh operation of the semiconductor device having the aforementioned configuration will be described hereinafter with reference to FIG. 10.

First, an operation of incrementing the control code CNT_CD<1:M> to output the specified address SADD<1:L> may be performed while the active operation is executed the number of times which the set code SET_CD<1:N> is set(see step S21). Next, an operation of updating the target address TADD<1:L> for a refresh operation may be performed if the counted control code CNT_CD<1:M> is greater than the counted set code SET_CD<1:N> (see step S22).

The operation (step S21) of incrementing the control code CNT_CD<1:M> will be described more fully hereinafter.

If the active operation is executed and the row address RADD<1:L> is inputted to the semiconductor device in synchronization with a time that the active command ACTCMD is enabled (see step S211), the row address RADD<1:L> may be compared with the target address TADD<1:L> (see step S212). If the row address RADD<1:L> is identical to the target address TADD<1:L>, an operation of selecting the specified address SADD<1:L> is not performed. If the row address RADD<1:L> is different than the target address TADD<1:L>, one of the target groups may be selected according to a logic level combination of the row address RADD<1:L> and the representative address of the selected target group selected as the specified address SADD<1:L> (see step S213). While the active operations are executed in sequence, the row address RADD<1:L> and the specified address SADD<1:L> inputted in synchronization with the active command ACTCMD may be compared (see step S214). If the row address RADD<1:L> and the specified address SADD<1:L> are identical to each other, the control code CNT_CD<1:M> may be incremented (see step S215). The step S214 of comparing the row address RADD<1:L> with the specified address SADD<1:L> and the step S215 of incrementing the control code CNT_CD<1:M> may be repeatedly performed until the active command ACTCMD is inputted a predetermined number of times (see step S216).

The operation (the step S22) of updating the target address TADD<1:L> will be described more fully hereinafter.

After the active command ACTCMD is inputted the predetermined number of times, the counted control code CNT_CD<1:M> may be compared with the counted storage code S_CD<1:M> (see a step S221). If the counted control code CNT_CD<1:M> is greater than or equal to the counted storage code S_CD<1:M>, the target address TADD<1:L> may be updated as the specified address SADD<1:L> (see step S222). If the counted control code CNT_CD<1:M> is less than the counted storage code S_CD<1:M>, the target address TADD<1:L> may be maintained (see a step S223). Whether or not memory cells corresponding to the target address TADD<1:L> are refreshed may be discriminated (see a step S224). If the memory cells corresponding to the target address TADD<1:L> are not refreshed, the step S21 of incrementing the control code CNT_CD<1:M> may be performed again.

Figure 11:
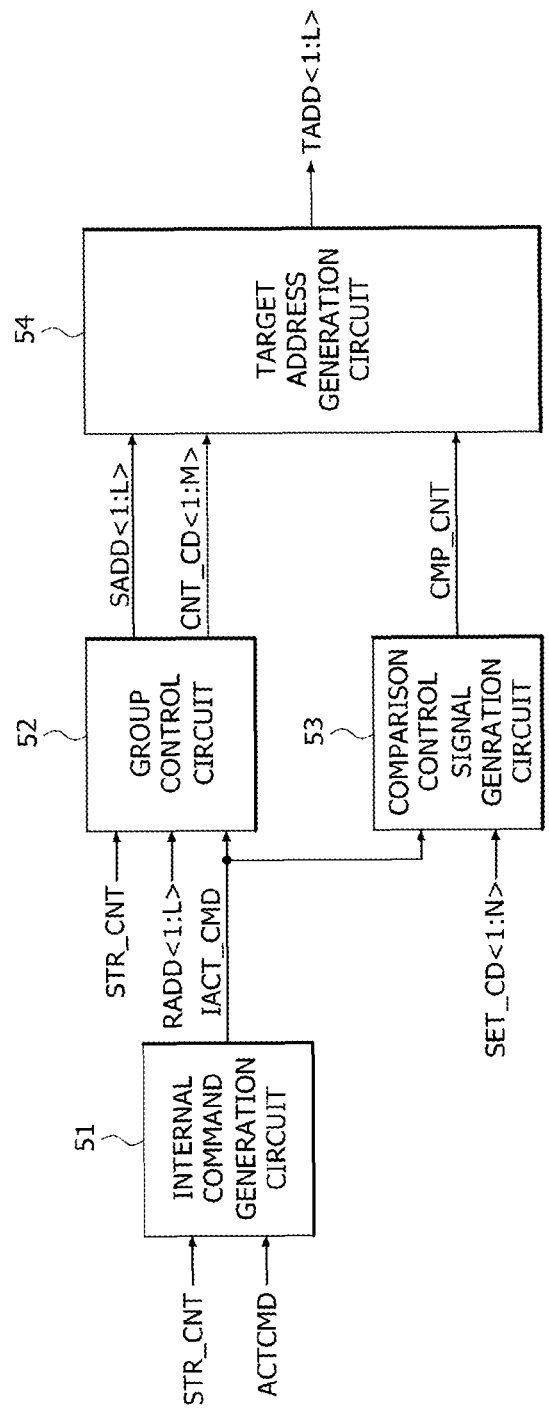
FIG. 11 is a block diagram illustrating a configuration of a semiconductor device according to yet another embodiment of the present disclosure.

As illustrated in FIG. 11, a semiconductor device according to yet another embodiment may include an internal command generation circuit 51, a group control circuit 52, a comparison control signal generation circuit 53, and a target address generation circuit 54.

The internal command generation circuit 51 may generate an internal active command IACT_CMD in response to a start control signal STR_CNT and an active command ACTCMD. The internal command generation circuit 51 may buffer the active command ACTCMD to output the internal active command IACT_CMD in synchronization with a time that the start control signal STR_CNT is enabled. An active operation for selecting a specified address SADD<1:L> among active operations performed by the internal active command IACT_CMD may start after the start control signal STR_CNT is enabled.

The group control circuit 52 may generate the specified address SADD<1:L> and a control code CNT_CD<1:M> in response to the start control signal STR_CNT, a row address RADD<1:L>, and the internal active command IACT_CMD. The group control circuit 52 may select a target group (see FIG. 2, for example) according to a logic level combination of the row address RADD<1:L> if the active operation is performed according to the internal active command IACT_CMD in synchronization with a time that the start control signal STR_CNT is enabled, and the group control circuit 52 may select and output a predetermined representative address of the selected target group as the specified address SADD<1:L>. The operation that the group control circuit 52 selects and outputs the predetermined representative address of the selected target group as the specified address SADD<1:L> may be performed by only a first active operation which is performed according to the internal active command IACT_CMD after the start control signal STR_CNT is enabled. The group control circuit 52 may generate the control code CNT_CD<1:M> that is sequentially incremented if the row address RADD<1:L> having the same logic level combination as the specified address SADD<1:L> is inputted in synchronization with a time that the internal active command IACT_CMD is enabled. The number of bits included in the control code CNT_CD<1:M> may be set to according to the embodiment.

The comparison control signal generation circuit 53 may generate a comparison control signal CMP_CNT in response to the internal active command IACT_CMD and a set code SET_CD<1:N>. The comparison control signal generation circuit 53 may generate the comparison control signal CMP_CNT which is enabled if the active operation is performed in response to the internal active command IACT_CMD the number of times which the set code SET_CD<1:N> is set. The number of times the set code SET_CD<1:N> is set may diff according to the embodiment.

The target address generation circuit 54 may output the specified address SADD<1:L> as a target address TADD<1:L> in response to the comparison control signal CMP_CNT and the control code CNT_CD<1:M>. The target address generation circuit 54 may perform an update operation outputting the specified address SADD<1:L> as the target address TADD<1:L> if the counted control code CNT_CD<1:M> is greater than the counted code stored in the target address generation circuit 54 while the comparison control signal CMP_CNT is enabled after the active operation is performed the predetermined number of times. If the update operation is performed, the target address generation circuit 54 may internally store the control code CNT_CD<1:M> for a next update operation.

Figure 12:
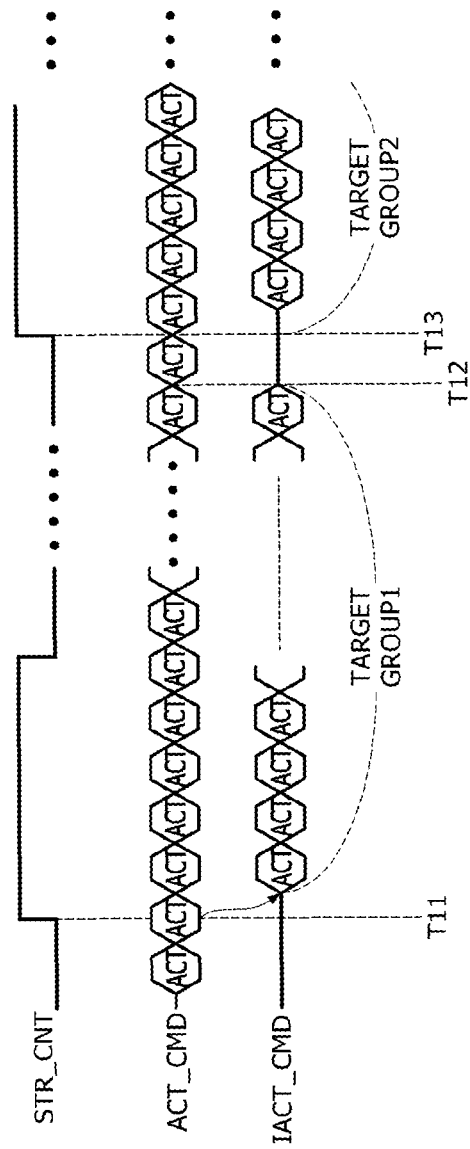
FIG. 12 is a timing diagram illustrating an operation of the semiconductor device shown in FIG. 11.

An operation of the internal command generation circuit 51 for generating the internal active command IACT_CMD according to the start control signal STR_CNT and the active command ACTCMD will be described hereinafter with reference to FIG. 12.

If the start control signal STR_CNT is enabled at time "T11", the active command ACTCMD is buffered and outputted as the internal active command IACT_CMD. At time "T12", the representative address of the first target address (TARGET ADDRESS 1) may be selected as the specified address SADD<1:L> until the active operation executed according to the internal active command IACT_CMD is performed the predetermined number of times, and whether or not the update operation replacing the specified address SADD<1:L> with the target address TADD<1:L> is performed may be determined.

The representative address of the second target address (TARGET ADDRESS 2) may be selected as the specified address SADD<1:L> associated with the internal active command IACT_CMD that is the buffered active command ACTCMD and specified address SADD<1:L> may be outputted in synchronization with a time "T13" in which the start control signal STR_CNT is enabled again, and whether or not the update operation replacing the specified address SADD<1:L> with the target address TADD<1:L> is performed may be determined after the time "T13".

Figure 13:
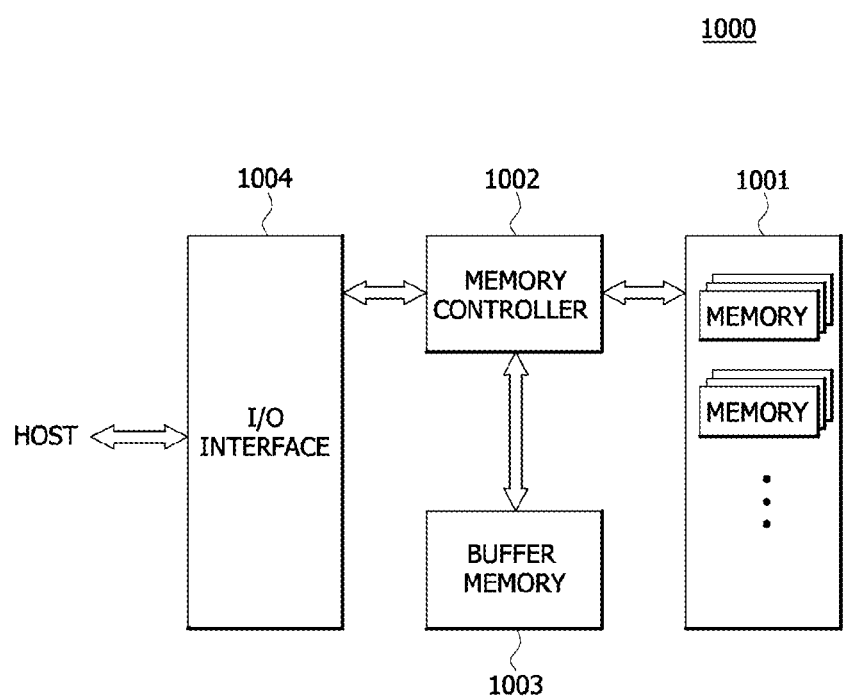
FIG. 13 is a block diagram illustrating a configuration of an electronic system including at least one of the semiconductor devices shown in FIGS. 1, 8, and 11.

At least one of the semiconductor devices described with reference to FIGS. 1, 8 and 11 may be applied to an electronic system that includes a memory system, a graphic system, a computing system, a mobile system, or the like. For example, as illustrated in FIG. 13, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal generated from the memory controller 1002. The data storage circuit 1001 may include at least one of the semiconductor devices illustrated in FIGS. 1, 8 and 11. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003, or for outputting the data stored in the data storage circuit 1001 or the buffer memory 1003. Although FIG. 13 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which is processed by the memory controller 1002. That is, the buffer memory 1003 may temporarily store the data which is outputted from or inputted to the data storage circuit 1001. The buffer memory 1003 may store data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the embodiments described above, a specified address may be selected while an active operation is performed a predetermined number of times, and a target address for a refresh operation may be stably generated by discriminating whether the target address should be replaced with the specified address according to the number of times that the active operation on the specified address is performed.

What is claimed is:

1. A semiconductor device comprising:
    a group control circuit configured to generate a specified address and a control code in response to a row address and an active command;
    a comparison control signal generation circuit configured to generate a comparison control signal in response to the active command and a set code; and
    a target address generation circuit configured to output the specified address as a target address in response to the control code and the comparison control signal.

2. The semiconductor device of claim 1, wherein the row address has logic level combinations for selecting word lines included in a core region.

3. The semiconductor device of claim 1, wherein the group control circuit selects a target group in response to the row address and outputs a representative address of the selected target group as the specified address.

4. The semiconductor device of claim 1, wherein the group control circuit generates the control code that is sequentially incremented if the row address having a same logic level combination as the specified address is inputted.

5. The semiconductor device of claim 1, wherein the comparison control signal is enabled if an active operation executed in response to the active command is performed the number of times the set code is set.

6. The semiconductor device of claim 1, wherein the target address generation circuit performs an update operation outputting the specified address as the target address if a control code count is greater than a count of a code stored in the target address generation circuit while the comparison control signal is enabled.

7. The semiconductor device of claim 6, wherein if the control code count is greater than a storage code count stored in the target address generation circuit while the comparison control signal is enabled, the target address generation circuit stores the control code as the storage code.

8. The semiconductor device of claim 1, wherein the group control circuit includes:
    a specified address selection circuit configured to select one of target groups in response to the row address and configured to output a representative address of the selected target group as the specified address;
    an address comparison circuit configured to compare the row address with the specified address to generate an address comparison signal; and
    a code counter configured to generate the control code that is incremented in response to the address comparison signal.

9. The semiconductor device of claim 1, wherein the comparison control signal generation circuit includes:

an active code counter configured to generate an active code that is incremented the number of times that an active operation is performed in response to the active command; and a code comparison circuit configured to generate the comparison control signal which is enabled if the active code count corresponds to a logic level combination of the set code.

10. The semiconductor device of claim 1, wherein the target address generation circuit includes a code register configured to store the control code therein in response to an update signal and configured to output the stored control code as a storage code.

11. The semiconductor device of claim 10, wherein the target address generation circuit further includes an update signal generation circuit configured to generate the update signal which is enabled if the control code count is greater than or equal to the a storage code count.

12. The semiconductor device of claim 10, wherein the target address generation circuit further includes a target address latch circuit configured to output the specified address as the target address in response to the update signal.

13. A semiconductor device comprising:
a group control circuit configured to generate a specified address and a control code in response to a target address, a row address, and an active command;
a comparison control signal generation circuit configured to generate a comparison control signal in response to the active command and a set code; and
a target address generation circuit configured to output the specified address as the target address in response to the control code and the comparison control signal.

14. The semiconductor device of claim 13, wherein the group control circuit is configured to select a target group in response to the row address if the row address inputted to select the specified address is different from the target address, and is configured to output a representative address of the selected target group as the specified address.

15. The semiconductor device of claim 13, wherein the group control circuit is configured to maintain a logic level combination of the specified address if the row address inputted to select the specified address is identical to the target address.

16. The semiconductor device of claim 13, wherein the group control circuit includes:

a selection control signal generation circuit configured to generate a selection control signal in response to the row address and the target address; and a specified address selection circuit configured to select one of target groups in response to the row address if the selection control signal is enabled and configured to output a representative address of the selected target group as the specified address.

17. The semiconductor device of claim 16, wherein the group control circuit further includes:
an address comparison circuit configured to compare the row address with the specified address to generate an address comparison signal; and
a code counter configured to generate the control code that is counted in response to the address comparison signal.

18. A semiconductor device comprising:
an internal command generation circuit configured to generate an internal active command in response to a start control signal and an active command;
a group control circuit configured to generate a specified address and a control code in response to the start control signal, a row address, and the internal active command;
a comparison control signal generation circuit configured to generate a comparison control signal in response to the internal active command and a set code; and
a target address generation circuit configured to output the specified address as a target address in response to the control code and the comparison control signal.

19. The semiconductor device of claim 18, wherein the internal command generation circuit is configured to buffer the active command to output the internal active command in synchronization with a time that the start control signal is enabled.

20. The semiconductor device of claim 18, wherein the group control circuit is configured to select a target group in response to the row address if an active operation is performed according to the internal active command in synchronization with a point of time that the start control signal is enabled, and is configured to select and output a representative address of the selected target group as the specified address.

* * * * *